(12) United States Patent
Liang

(10) Patent No.: US 11,923,226 B2
(45) Date of Patent: Mar. 5, 2024

(54) CONVEYOR DEVICE AND SEMICONDUCTOR PRODUCTION EQUIPMENT

(71) Applicant: CHANGXIN MEMORY TECHNOLOGIES, INC., Hefei (CN)

(72) Inventor: Xueyu Liang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 356 days.

(21) Appl. No.: 17/439,596

(22) PCT Filed: Jun. 21, 2021

(86) PCT No.: PCT/CN2021/101295
§ 371 (c)(1),
(2) Date: Sep. 15, 2021

(87) PCT Pub. No.: WO2022/095459
PCT Pub. Date: May 12, 2022

(65) Prior Publication Data
US 2023/0067252 A1   Mar. 2, 2023

(30) Foreign Application Priority Data
Nov. 3, 2020   (CN) .......................... 202011212708.5

(51) Int. Cl.
*H01L 21/68*   (2006.01)
*B65G 43/08*   (2006.01)
(Continued)

(52) U.S. Cl.
CPC ...... *H01L 21/67706* (2013.01); *G01L 5/0085* (2013.01); *G01L 5/226* (2013.01)

(58) Field of Classification Search
CPC . H01L 21/68; H01L 21/677; H01L 21/67706; G01L 2/226; G01L 5/0085
USPC ................................ 198/346.3, 463.3, 750.1
See application file for complete search history.

(56) References Cited

U.S. PATENT DOCUMENTS 7,410,340 B2 *   8/2008   Bonora ............. H01L 21/67736
                                                              414/940
7,673,735 B2 *   3/2010   Rice .................. H01L 21/67769
                                                              198/465.4
(Continued)

FOREIGN PATENT DOCUMENTS

| CN | 202839565 U | 3/2013 |
| CN | 202871761 U | 4/2013 |
| CN | 107161238 A | 9/2017 |
| CN | 211680609 U | 10/2020 |

OTHER PUBLICATIONS

UF 2022/0076984 A1, Durand et al., Mar. 10, 2022.*
International Search Report and Written Opinion as cited in PCT/CN2021/101295 dated Sep. 27, 2021, 9 pages.

*Primary Examiner* — Douglas A Hess
(74) *Attorney, Agent, or Firm* — Cooper Legal Group, LLC

(57) ABSTRACT

This application provides a conveyor device and semiconductor production equipment, and relates to the technical field of semiconductor production equipment. The conveyor device is installed on a machine platform of semiconductor production equipment, the machine platform is provided with a guide structure, and the guide structure is provided with multiple oil injection ports arranged along an extension direction of the guide structure. The conveyor device includes a conveyor platform and a driving mechanism, where the conveyor platform is slidably installed on the guide structure to carry and convey wafers, the conveyor (Continued)

platform covers at least one of the multiple oil injection ports, and the driving mechanism is connected to the conveyor platform.

15 Claims, 6 Drawing Sheets

(51) Int. Cl.
*B65G 49/04* (2006.01)
*G01L 5/00* (2006.01)
*G01L 5/22* (2006.01)
*H01L 21/677* (2006.01)

(56) References Cited

U.S. PATENT DOCUMENTS

| | | | | |
|---|---|---|---|---|
| 8,235,000 B2* | 8/2012 | Spangler | ............... | B65G 43/10 |
| | | | | 118/712 |
| 8,430,229 B2* | 4/2013 | Abbestam | ............ | B23Q 7/1447 |
| | | | | 198/463.3 |
| 8,734,079 B1* | 5/2014 | Razumov | ............ | B65G 1/0492 |
| | | | | 414/331.14 |
| 8,882,431 B2* | 11/2014 | Hashimoto | .............. | B25J 9/041 |
| | | | | 414/222.07 |
| 9,824,907 B2* | 11/2017 | Igarashi | ............ | H01L 21/67775 |
| 10,593,575 B2* | 3/2020 | Miner | .............. | G05B 19/41875 |
| 11,538,704 B2* | 12/2022 | Watanabe | ......... | H01J 37/32788 |
| 2019/0229003 A1 | 7/2019 | Kesil | | |

* cited by examiner

CONVEYOR DEVICE AND SEMICONDUCTOR PRODUCTION EQUIPMENT

CROSS-REFERENCE TO RELATED APPLICATIONS

This application claims priority to Chinese Patent Application No. 202011212708.5, titled "CONVEYOR DEVICE AND SEMICONDUCTOR PRODUCTION EQUIPMENT", filed with China National Intellectual Property Administration (CNIPA) on Nov. 3, 2020, which is incorporated herein by reference in its entirety.

TECHNICAL FIELD

This application relates to the technical field of semiconductor production equipment, and in particular, to a conveyor device and semiconductor production equipment.

BACKGROUND

In a semiconductor fabrication process, semiconductor production equipment needs to be used to conduct wafer coating, development, and etching. Generally, the semiconductor production equipment includes a machine platform and a conveyor device slidably arranged on the machine platform. The conveyor device includes a conveyor platform and a driving mechanism. An output end of the driving mechanism is connected to the conveyor platform to drive the conveyor device to move along a predetermined track, to convey wafers to different chambers of the semiconductor production equipment for related processing.

To ensure normal operation of the semiconductor production equipment, the machine platform and the conveyor device are usually provided with oil injection ports, and lubricating oil or protective materials are added into the oil injection ports for regular maintenance and repair of the semiconductor production equipment.

However, during the maintenance and repair, the conveyor device usually covers the oil injection ports, and consequently an operator cannot add the lubricating oil into the oil injection ports. Therefore, the operator needs to push or pull the conveyor device to expose the oil injection ports, resulting in low oil injection efficiency and poor safety.

SUMMARY

The embodiments of this application provide the following technical solutions.

A first aspect of the embodiments of this application provides a conveyor device, installed on a machine platform of semiconductor production equipment. The machine platform is provided with a guide structure, and the guide structure is provided with multiple oil injection ports arranged along an extension direction of the guide structure. The conveyor device includes a conveyor platform and a driving mechanism. The conveyor platform is slidably installed on the guide structure to carry and convey wafers, and the conveyor platform covers at least one of the multiple oil injection ports. The driving mechanism is connected to the conveyor platform, and the driving mechanism is configured to drive the conveyor platform to move up or down relative to the machine platform, to expose the oil injection ports covered by the conveyor platform.

A second aspect of the embodiments of this application provides a semiconductor production equipment, including a machine platform and the conveyor device described above. The machine platform includes a rack and a guide structure arranged on the rack, and the guide structure is provided with multiple oil injection ports arranged along an extension direction of the guide structure. The conveyor platform of the conveyor device is slidably installed on the guide mechanism, and the conveyor platform covers at least one of the multiple oil injection ports. One end of a driving mechanism of the conveyor device is arranged on the rack, and the other end of the driving mechanism is connected to the conveyor platform. The driving mechanism is configured to drive the conveyor platform to move up or down relative to the machine platform, to expose the oil injection ports covered by the conveyor platform.

BRIEF DESCRIPTION OF THE DRAWINGS

To describe the technical solutions in the embodiments of this application or in the prior art more clearly, the following briefly describes the accompanying drawings required for the embodiments or the prior art. Apparently, the accompanying drawings in the following description show merely some embodiments of this application, and persons of ordinary skill in the art may still derive other accompanying drawings from these accompanying drawings without creative efforts.

DETAILED DESCRIPTION

The inventor of this application found in an actual working process that a conveyor device of semiconductor production equipment usually covers some oil injection ports on a machine platform. To inject oil into oil injection ports of the semiconductor production equipment, the semiconductor production equipment needs to be powered off first. Then, an operator pushes or pulls the conveyor device, and exerts acting force on the conveyor device all the time to expose the oil injection ports covered by the conveyor device. Another operator injects lubricating oil into the oil injection ports to complete a process of oil injection for the semiconductor device. However, the foregoing operation process has to be completed by two operators, and the oil injection efficiency is low. In addition, the conveyor device has a relatively large weight, and easily hurts the operators, leading to high labor intensity and poor safety.

In view of the above technical problems, the embodiments of this application provide a conveyor device and semiconductor production equipment. A driving mechanism is arranged on a machine platform. An output end of the driving mechanism is connected to a conveyor platform. The driving mechanism drives the conveyor platform to move up or down relative to the machine platform, to expose an oil injection port covered by the conveyor platform. In this way, an operator does not need to manually push or pull the conveyor device, thereby improving oil injection efficiency and safety.

To make the above objectives, features, and advantages of the embodiments in this application more obvious and understandable, the following clearly and completely describes the technical solutions in the embodiments of this application with reference to accompanying drawings in the embodiments of this application. Apparently, the described embodiments are merely some rather than all of the embodiments of this application. All other embodiments obtained by persons of ordinary skill in the art based on the embodiments in this application without creative efforts shall fall within the protection scope of this application.

Figure 1:
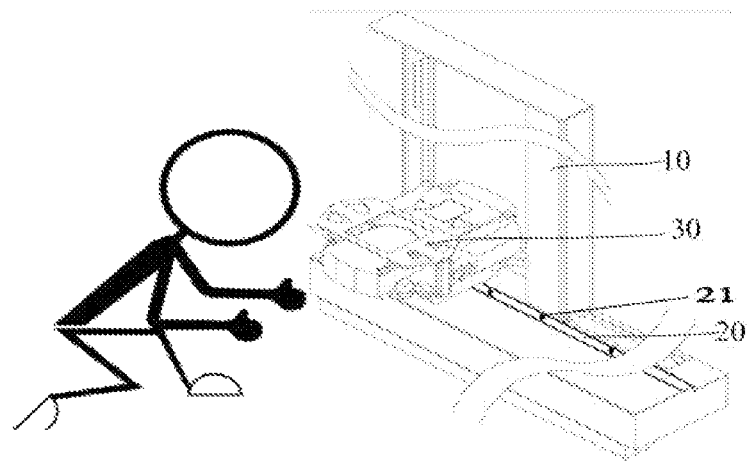
FIG. 1 is a schematic diagram of a partial structure of semiconductor production equipment according to an embodiment of this application.

As shown in FIG. 1, an embodiment of this application provides semiconductor production equipment, including a machine platform 10 and a conveyor device installed on the machine platform 10. The machine platform 10 is configured to provide a bearing carrier for the conveyor device or another component. The machine platform 10 may include a rack and a guide structure 20 arranged on the rack. The guide structure 20 is provided with multiple oil injection ports 21 arranged along an extension direction of the guide structure 20. Lubricating oil may be injected into the guide structure 20 through the oil injection ports to ensure normal operation of the guide structure 20.

The guide structure 20 may be a slide rail arranged on the machine platform 10 and a sliding block slidably arranged on the slide rail. In this way, a conveyor platform 30 of the conveyor device can be installed on the sliding block. When acting force is exerted on the conveyor platform 30, the conveyor platform 30 may move along the slide rail to convey a wafer on the conveyor platform 30 to a specified position.

It should be noted that in this embodiment, the multiple oil injection ports may be evenly arranged along the extension direction of the guide structure 20, or may be unevenly arranged.

Figure 2:
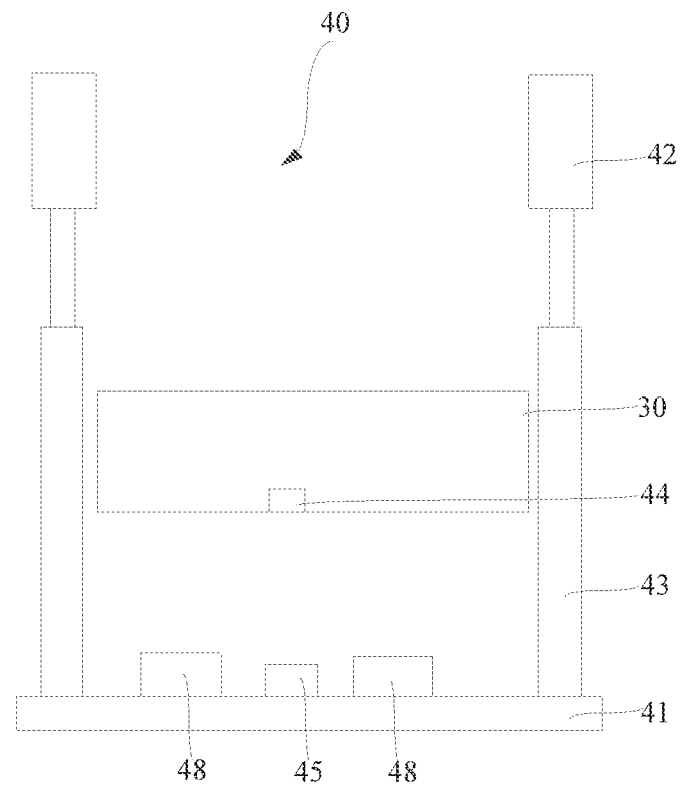
FIG. 2 is a schematic structural diagram of a driving mechanism and a conveyor platform according to an embodiment of this application.

As shown in FIG. 1 and FIG. 2, the conveyor device includes the conveyor platform 30 and a driving mechanism 40 connected to the conveyor platform. The conveyor platform 30 is slidably installed on the guide structure 20. In other words, the conveyor platform 30 may be installed on the sliding block, and the sliding block is slidably arranged on the slide rail.

The conveyor platform 30 is configured to bear and convey the wafer, to convey the wafer to the specified position for related processing. The guide structure 20 is provided with the oil injection ports, and the conveyor platform 30 covers at least one of the multiple oil injection ports. Therefore, when there is a need to inject the oil into the oil injection ports, the conveyor platform 30 needs to be moved to expose the oil injection ports covered by the conveyor platform 30.

Therefore, the driving mechanism 40 is disposed in the conveyor device provided in this embodiment of this application. One end of the driving mechanism 40 is arranged on the rack. For example, one end of the driving mechanism 40 may be welded on the rack. The other end of the driving mechanism 40 is connected to the conveyor platform 30, and is configured to provide power for the conveyor platform 30, to drive the conveyor platform 30 to move up or down relative to the machine platform 10, to expose the oil injection ports covered by the conveyor platform 30. In this way, an operator does not need to manually push or pull the conveyor device, thereby improving oil injection efficiency and safety.

In this embodiment, the driving mechanism 40 may be a cylinder or a linear motor arranged on the rack, and a piston rod of the cylinder or an output shaft of the linear motor is connected to the conveyor platform 30. The piston rod or the output shaft stretches out and draws back to drive the conveyor platform to move up or down.

Figure 3:
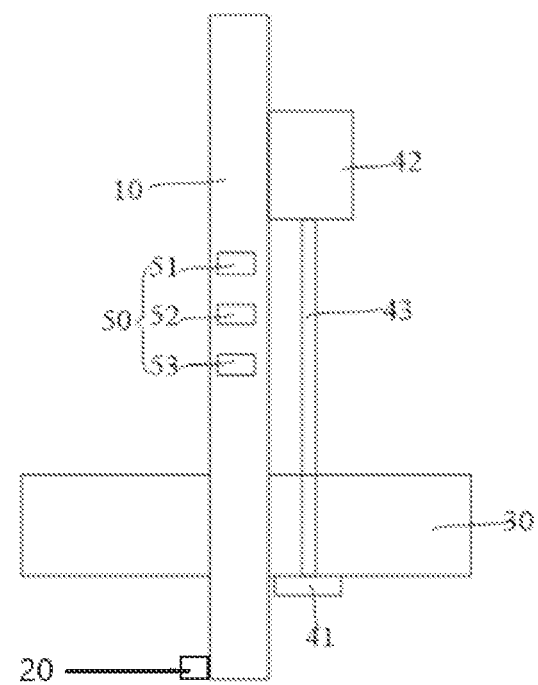
FIG. 3 is a side view of FIG. 2.

In some embodiments, as shown in FIG. 2 and FIG. 3, the driving mechanism 40 includes a support piece 41 and a driver 42 connected to the support piece 41. The support piece 41 is located below the conveyor platform 30, is connected to the conveyor platform 30, and is configured to bear the conveyor platform. The driver 42 drives, by using the support piece 41, the conveyor platform 30 to move up or down relative to the machine platform.

In this embodiment, when there is a need to inject the oil into the oil injection ports, the driver 42 drives the support piece 41 to move along a direction towards the conveyor platform 30, so that an upper surface of the support piece 41 is in contact with a lower surface of the conveyor platform 30, to provide support force for the conveyor platform 30. The driver 42 continues to move, and drives the support piece 41 to move up relative to the machine platform 10, to expose the oil injection ports covered by the conveyor platform 30. In this case, the driver 42 stops moving, so that the conveyor platform 30 is kept at a specific position, and the operator can inject the oil into the oil injection ports.

After oil injection is completed, the driver 42 drives the support piece 41 to move down relative to the machine platform 10. In this process, because the conveyor platform 30 is relatively heavy, the conveyor platform 30 relies on gravity to be in contact with the support piece 41, and moves down together with the support piece 41 relative to the machine platform 10 until the conveyor platform 30 falls back onto the guide structure 20.

It should be noted that the driver 42 may be located above the support piece 41, and an output end of the driver 42 is connected to a side surface of the support piece 41 facing toward the conveyor platform 30. When the output end of the driver 42 draws back, the support piece 41 moves from bottom to top relative to the machine platform 10; and when the output end of the driver 42 stretches out, the support piece 41 moves from top to bottom relative to the machine platform 10.

In addition, the driver 42 may alternatively be located below the support piece 41, and the output end of the driver 42 is connected to a side surface of the support piece 41 and facing away from the conveyor platform 30, that is, on the lower surface of the conveyor platform 30. When the output end of the driver 42 stretches out, the support piece 41 moves from bottom to top relative to the machine platform 10; and when the output end of the driver 42 draws back, the support piece 41 moves from top to bottom relative to the machine platform 10.

In some embodiments, the support piece 41 includes a support plate, one end of the driver 42 is connected to an upper surface of the support plate or a lower surface of the support plate, and the other end of the driver 42 is connected to the machine platform 10. One end of the driver 42 may be fixedly connected to the support plate. For example, one end of the driver 42 may be welded to the support plate. The other end of the driver 42 may alternatively be fixedly connected to the machine platform 10 through welding or bolted connection.

In this embodiment, a shape of the support plate may match a shape of the conveyor platform 30, and the support plate may be a square plate. The square plate is made of stainless steel, and the support plate made of stainless steel has advantages of high structural strength and corrosion resistance.

In addition, an area of the support plate may be greater than that of the conveyor platform 30, or may be less than that of the conveyor platform 30. Preferably, the area of the support plate may be greater than that of the conveyor platform 30. In this case, a supporting capability of the support plate is improved.

To ensure that the conveyor platform 30 moves up or down steadily, two baffles arranged at an interval may be arranged on a side surface of the support plate facing toward the conveyor platform, and a spacing between the two baffles may be slightly greater than a length or a width of the conveyor platform 30. The conveyor platform 30 can be limited by providing the two baffles, to ensure stability of the conveyor platform.

In some embodiments, the driver 42 includes a driving cylinder, one end of the driving cylinder is connected to the support plate, and the other end of the driving cylinder is fixedly connected to the machine platform 10 through welding. Connection strength between the driving cylinder and the machine platform can be improved through welding.

The driving cylinder may be directly connected to the support plate, or may be connected to the support plate by a connecting rod 43. Because a size of a piston rod of the driving cylinder is fixed, during installation of the driving cylinder on the rack, another component located above or below the conveyor platform may interfere with the driving cylinder. Therefore, in this embodiment, during the design of the connecting rod 43, the driving cylinder may be disposed at a position that is on the rack and that is relatively far away from the support plate, to improve installation convenience of the driving cylinder. The connecting rod 43 may be a solid rod made of stainless steel, or may be a stainless steel tube.

There may be many options for a quantity of driving cylinders. For example, there may be one driving cylinder. The piston rod of the driving cylinder may be connected to a geometric center of the support plate, that is, an intersection between two diagonal lines of the support plate. For another example, there may be two driving cylinders, as shown in FIG. 2. The two driving cylinders are symmetrically disposed relative to a central axis of the support plate, so that motion stability of the support plate can be ensured.

Figure 4:
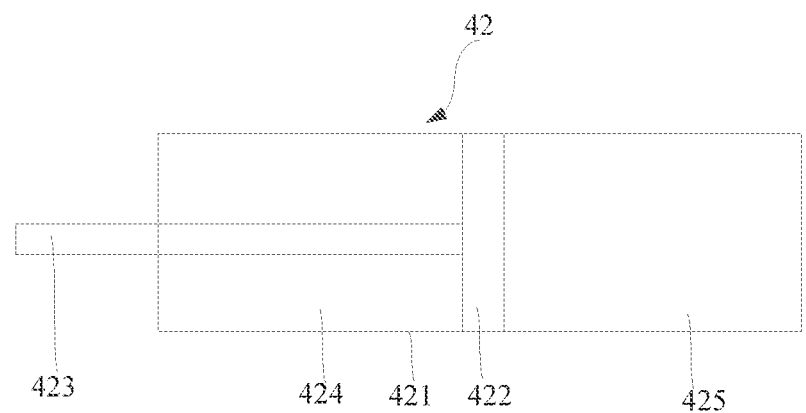
FIG. 4 is a schematic structural diagram of a driving cylinder according to an embodiment of this application.

In this embodiment, as shown in FIG. 4, the driving cylinder may include a cylinder block 421, a piston 422, and a piston rod 423. The piston 422 is disposed inside the cylinder block 421. One end of the piston rod 423 is connected to the piston 422, and the other end of the piston rod 423 moves relative to an axis of the cylinder block 421, to stretch out of the cylinder block 421 or draw back to the cylinder block 421.

The piston 422 divides an inner cavity of the cylinder block 421 into a first cavity 424 provided with the piston rod 423 and a second cavity 425 that is not provided with the piston rod 423. The first cavity 424 is provided with a first communication hole, and the second cavity 425 is provided with a second communication hole. When compressed air is introduced into the second cavity 425 through the second communication hole, air in the first cavity 424 is discharged through the first communication hole, so that a pressure difference is formed between the first cavity 424 and the second cavity 425. Under the action of the pressure, the piston rod 423 moves away from the second cavity 425, so that the piston rod 423 stretches out of the first cavity 424.

When the compressed air is introduced into the first cavity 424 through the first communication hole, air in the second cavity 425 is discharged through the second communication hole, so that a pressure difference is formed between the first cavity 424 and the second cavity 425. Under the action of the pressure, the piston rod 423 moves along a direction towards the second cavity 425, so that the piston rod 423 draws back to the first cavity 424.

When air is introduced into and discharged from the first cavity 424 and the second cavity 425 alternately, a reciprocating linear movement of the piston rod 423 can be realized, thereby driving the support plate to move up or down relative to the machine platform 10.

Figure 5:
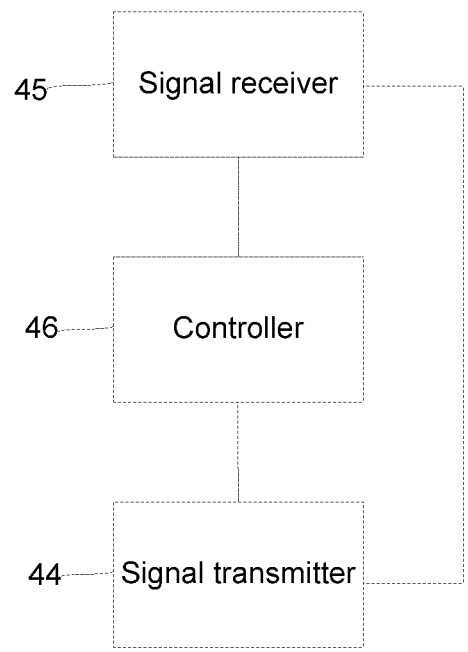
FIG. 5 is a circuit diagram 1 of a conveyor device according to an embodiment of this application.

In some embodiments, as shown in FIG. 2 and FIG. 5, the conveyor device includes a signal transmitter 44, a signal receiver 45, and a controller 46. The signal transmitter 44 is arranged on the conveyor platform 30. The signal receiver 45 is arranged on an upper surface of the support plate facing toward the conveyor platform 30. To enable a signal transmitted by the signal transmitter 44 to be quickly received by the signal receiver 45, the signal transmitter 44 may be arranged on a lower surface of the conveyor platform 30 facing toward the support plate.

The controller 46 is electrically connected to the signal transmitter 44 and the signal receiver 45 respectively. The controller 46 is configured to control the signal transmitter 44 to send a first signal to the signal receiver 45, and control, according to a second signal output by the signal receiver 45, a speed at which the driver 42 drives the conveyor platform 30 to move up or down relative to the machine platform 10. The second signal is generated by the signal receiver 45 through conversion of the first signal.

In some embodiments, the signal transmitter 44 is a light-emitting diode, the light-emitting diode is arranged on a side surface of the conveyor platform 30 facing toward the support plate, and the light-emitting diode is connected to the controller 46. The controller 46 is used as a power supply of the light-emitting diode. Under the control of the controller 46, the light-emitting diode can emit light with a frequency of 2 Hz, and controls the light to flash alternately at a specific frequency. The light with a frequency of 2 Hz is the first signal.

The signal receiver 45 is a photoelectric sensor, for example, a photoresistor. The signal receiver 45 is configured to receive the first signal, and transmits the first signal to a signal processor 47. The signal processor 47 can process the first signal, and convert the first signal to the second signal. The signal processor 47 transmits the second signal to the controller 46. The controller 46 controls, according to the second signal, the speed at which the driver 42 drives the conveyor platform 30 to move up or down relative to the machine platform 10.

Figure 6:
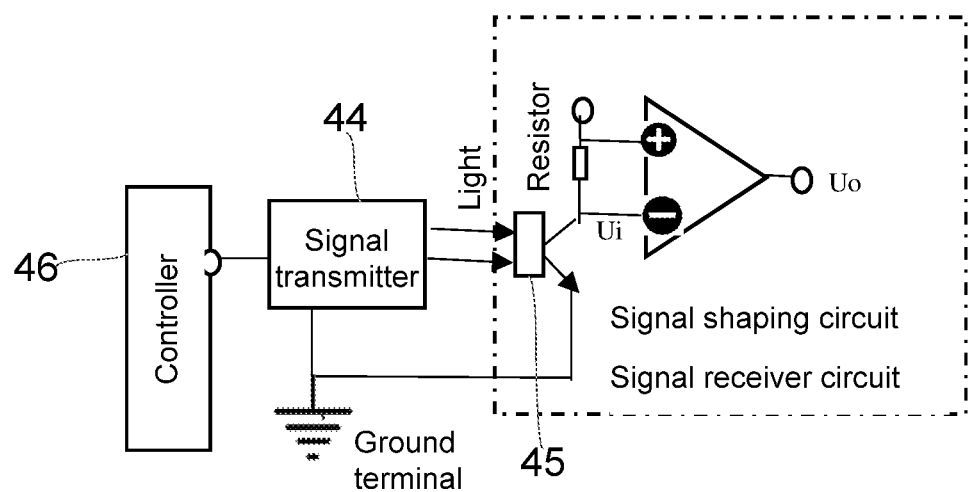
FIG. 6 is a circuit diagram 2 of a conveyor device according to an embodiment of this application.

The signal processor 47 may be disposed inside the signal receiver 45, and the signal processor 47 may include a signal shaping circuit and a signal conditioning circuit. A circuit of the signal receiver 45 is shown in FIG. 6. After light emitted by the light-emitting diode is received by the photoelectric sensor, a resistance of the signal receiver is decreased, so as to cause a change in an input value Ui. After a changed input value Ui is processed by the signal shaping circuit and the signal conditioning circuit, a second signal is formed. The signal processor 47 transmits the second signal to the controller 46. The controller 46 calculates a difference value between a time at which the light-emitting diode emits the light and a time at which the photoelectric sensor receives the light, calculates a distance a between the conveyor platform 30 and the support plate according to a formula S=vt, and controls, according to the distance a, the speed of the driver for driving the conveyor platform 30 to move up or down relative to the machine platform 10, so as to control a speed of the support plate. In this process, if the distance a is approximately equal to 0, it indicates that the support plate is in contact with the conveyor platform 30.

In some embodiments, the conveyor device further includes a pressure sensor 48 connected to the controller 46. The pressure sensor 48 may be arranged on the upper surface of the support plate facing toward the conveyor platform 30. When the support plate is in contact with the conveyor platform 30, a weight on the support plate begins to increase. The pressure sensor 48 may detect pressure borne by the support plate, and transmit the pressure value to the controller 46. The controller 46 can control, according to the pressure value detected by the pressure sensor 48, the speed of the driver for driving the conveyor platform 30 to move up or down relative to the machine platform 10.

In this process, there is a preset threshold in the controller 46. For example, the threshold is 100 N. The controller 46 can receive the pressure value detected by the pressure sensor 48, and compare the pressure value with the threshold. If the pressure value is greater than 100 N, it indicates that the support plate has fully supported the conveyor platform 30; and if the pressure value is less than 100 N, it indicates that the support plate has not fully supported the conveyor platform 30.

Figure 7:
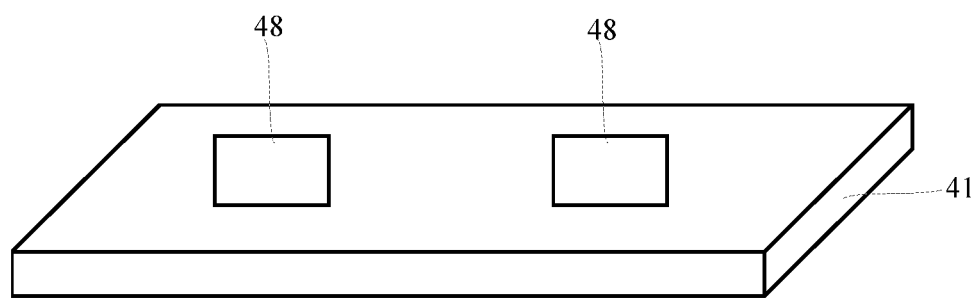
FIG. 7 is a schematic structural diagram of a support piece and a pressure sensor according to an embodiment of this application.

There may be one or two pressure sensors 48. As shown in FIG. 7, when there are two pressure sensors 48, the two pressure sensors 48 may be symmetrically disposed relative to a central axis of the support plate. In this way, summation processing may be conducted on pressure values detected by the two pressure sensors 48, and a sum of the pressure values detected by the two pressure sensors 48 is the pressure borne by the support plate.

In this embodiment, the pressure sensor 48 may be an MIK-P300 sensor. The pressure sensor 48 is provided with a pressure sensitive chip with high precision and stability. For the pressure sensitive chip, an advanced micro-mechanical etching processing technology is used, and a Wheatstone bridge is formed by distributing four high-precision resistors with a temperature compensation effect on a silicon wafer. Due to a piezoresistive effect, resistance values of the four bridge arm resistors change, the bridge is unbalanced. A sensitive element outputs an electrical signal corresponding to the pressure change. A 24-bit AD digital chip conducts amplification and nonlinearity correction-based compensation on the output electrical signal to generate a voltage signal and a current signal that are linearly corresponding to the input pressure. After the signal conditioning circuit conducts amplification, voltage stabilization, filtering, and A/D conversion on the voltage signal and the current signal, a digital signal that can be recognized by the controller is obtained. The controller conducts calculation on the digital signal and converts the digital signal to a pressure value.

Figure 8:
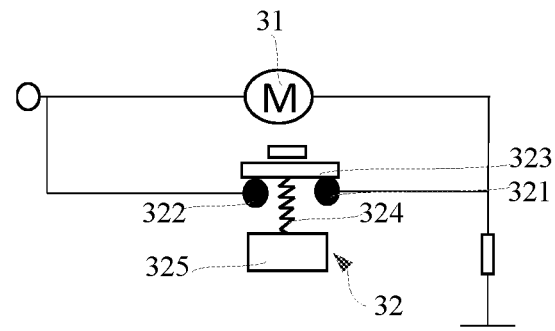
FIG. 8 is a schematic structural diagram of a motor and a switch according to an embodiment of this application.

In some embodiments, as shown in FIG. 8, the conveyor device further includes a motor 31 connected to the conveyor platform 30 and a switch 32 connected to the motor 31. When there is no need to inject the oil into the oil injection ports on the machine platform 10, the motor 31 is configured to drive the conveyor platform 30 to slide along the guide structure 20, and the switch 32 is configured to control a working status of the motor 31.

In actual application, the switch 32 may be manually turned on or off by an operator. For example, after visually observing that the support plate is in contact with the conveyor platform 30, the operator may manually turn off the switch 32, so that the motor 31 is powered off, and the conveyor platform 30 is supported only by the support plate.

In addition, the switch 32 may alternatively be controlled by the controller 46. For example, the switch 32 is connected to the controller 46, and the controller 46 is configured to control, according to the second signal and/or the pressure detected by the pressure sensor 48, the switch 32 to be turned on or off.

In other words, when the distance a between the conveyor platform 30 and the support plate received by the controller 46 is zero, and the pressure value detected by the pressure sensor 48 is greater than 100 N, the controller 46 controls the switch to be turned off, so that the motor 31 is powered off. In this case, no driving force is exerted on the conveyor platform 30, and the conveyor platform 30 is supported only by the support plate.

In this embodiment, the switch 32 includes a shell and a first contact 321, a second contact 322, a connecting plate 323, a reset spring 324, and an electromagnet 325 connected to the reset spring 324 that are disposed inside the shell. One end of the connecting plate 323 is rotatably connected to the first contact 321. The reset spring 324 is arranged on a lower surface of the connecting plate 323, and drives, through acting force of the reset spring 324, the connecting plate 323 to move towards or away from the second contact 322. The first contact 321 of the switch 32 is connected to one end of the motor 31 through a wire, and the second contact 322 of the switch 32 is connected to the other end of the motor 31 through a wire.

The electromagnet 325 is connected to the controller 46. When the controller 46 is used to energize the electromagnet 325, the electromagnet 325 generates attraction force. The electromagnet 325 attracts the reset spring 324, and drives, through the reset spring 324, the connecting plate 323 to move towards the second contact 322. When the connecting plate 323 is in contact with the second contact 322, the switch 32 makes the motor 31 short-circuited. In this case, the motor 31 is powered off.

After the operator completes the oil injection process, the controller 46 does not energize the electromagnet 325 any longer, and the electromagnet 325 does not generate attraction force. Under the action of elastic restoring force of the reset spring 324, the connecting plate 323 is driven to move in a direction away from the second contact 322. In this case, the motor 31 is powered on, so that the conveyor platform 30 stays on the guide structure 20.

In the foregoing embodiment, there may be one controller 46, and the controller 46 is electrically connected to all of the signal transmitter 44, the signal receiver 45, the pressure sensor 48, the driver 42, and the switch 32. In this case, a control circuit of the controller 46 is relatively complex. To simplify the controller 46 and improve control accuracy of the controller, the foregoing functions can be implemented by using two controllers.

Figure 9:
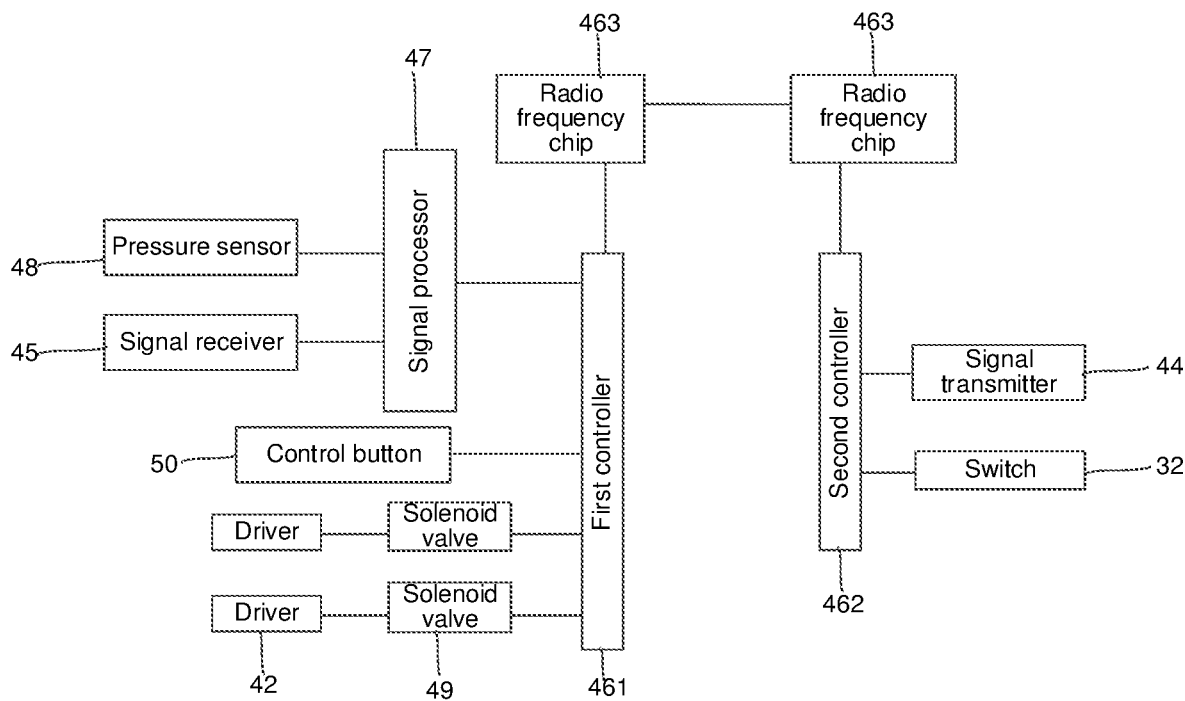
FIG. 9 is a circuit diagram 3 of a conveyor device according to an embodiment of this application.

In some embodiments, as shown in FIG. 9, the controller 46 may include a first controller 461, a second controller 462, and radio frequency chips 463, and the first controller 461 is connected to the second controller 462 by the radio frequency chips 463. The first controller 461 is respectively connected to the signal receiver 45, the pressure sensor 48, and the driver 42, and is configured to control, according to the second signal and the pressure detected by the pressure sensor 48, the speed at which the driver 42 drives the conveyor platform 30 to move up or down relative to the machine platform 10. The second controller 462 is connected to the switch 32, and is configured to control, according to an output signal of the first controller 461, the switch 32 to be turned on or off.

Figure 10:
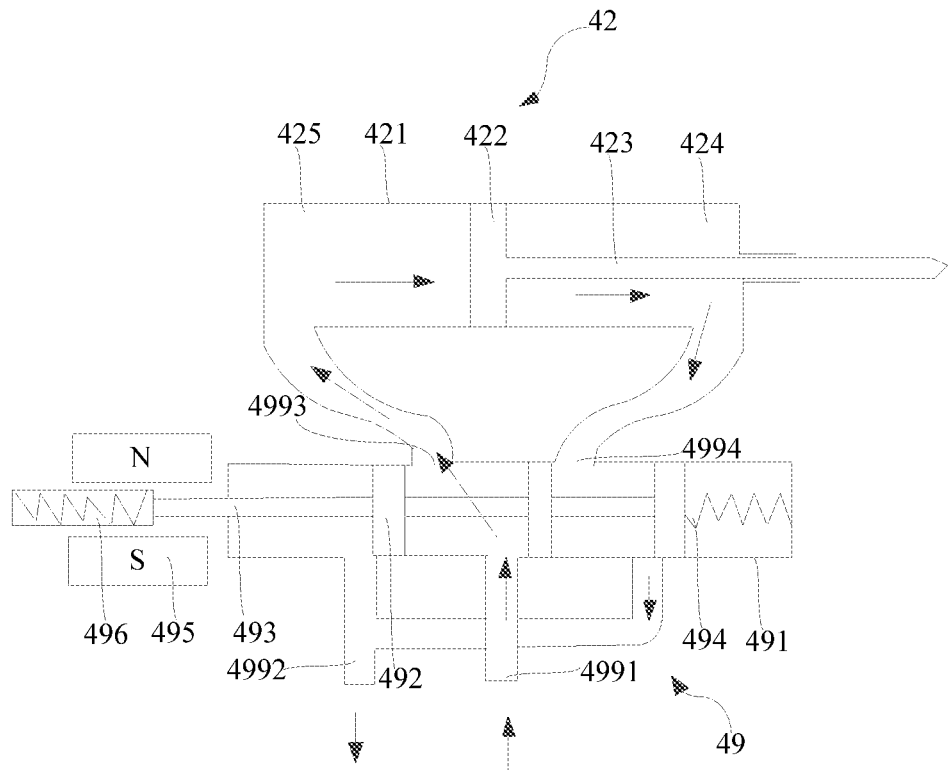
FIG. 10 shows a working state 1 of a driver and a solenoid valve according to an embodiment of this application.

In the foregoing process, the first controller 461 may control, by using a solenoid valve 49, the speed at which the driver 42 drives the conveyor platform 30 to move up or down relative to the machine platform 10. For example, as shown in FIG. 10, the solenoid valve 49 may be a straight-type magnetic slide valve. The solenoid valve 49 may include a valve body 491, and a valve element 492 and a valve rod 493 that are disposed inside the valve body 491. The valve element 492 is disposed inside the valve body by using a first spring 494. One end of the valve rod 493 is connected to the valve element 492, the other end of the valve rod 493 extends out of the valve body 491, and a part that is of the valve rod 493 and that is located outside the valve body 491 is sleeved with an electromagnetic coil 495 and a second spring 496.

The valve body 491 is provided with an air inlet 4991, an exhaust port 4992, a first air outlet 4993, and a second air outlet 4994 that are communicated with an inner cavity of the valve body. The first air outlet 4993 is communicated with a second communication hole of the cylinder, and the second air outlet 4994 is communicated with a first communication hole of the cylinder.

An orientation shown in FIG. 10 is used as an example. When the electromagnetic coil 495 is energized, the valve element 492 moves to the right along an axis of the valve rod under the push of the second spring 496, so that the air inlet 4991, the first air outlet 4993, and the second communication hole are communicated with each other, and the first communication hole, the second air outlet 4994, and the exhaust port 4992 are communicated with each other. In this case, pressure in the second cavity 425 is higher than pressure in the first cavity 424. A pressure difference drives the piston rod 423 to move in a direction away from the second cavity 425, so that the piston rod 423 extends out of the cylinder block 421, so as to push the support plate to move up or down relative to the machine platform 10.

Figure 11:
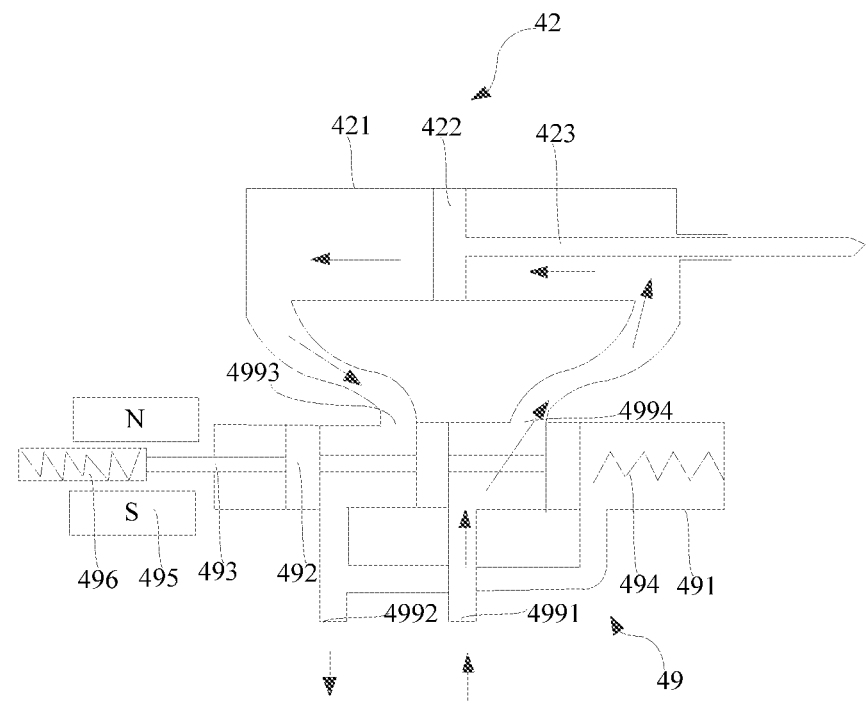
FIG. 11 shows a working state 2 of a driver and a solenoid valve according to an embodiment of this application.

As shown in FIG. 11, when the electromagnetic coil 495 is de-energized, under the action of elastic restoring force of the first spring 494 and the second spring 496, the valve element 492 moves to the left along an axial direction of the valve rod 493, so that the air inlet 4991, the second air outlet 4994, and the first communication hole are communicated with each other, and the second communication hole, the first air outlet 4993, and the exhaust port 4992 are communicated with each other. In this case, pressure in the first cavity 424 is higher than pressure in the second cavity 425. A pressure difference drives the piston rod 423 to move in a direction towards the second cavity 425, so that the piston rod 423 draws back to the cylinder block 421, so as to push the support plate to move up or down relative to the machine platform 10.

When the cylinder does not need to work, the electromagnetic coil 495 moves to a suitable position under the action of an electrical signal to block both the air inlet 4991 and the exhaust port 4992 of the solenoid valve 49, so that the cylinder is still.

In this embodiment, confusion of control instructions can be prevented by providing the first controller 461 and the second controller 462, to ensure action sensitivity and accuracy of the driver 42 and the switch 32.

In some embodiments, the radio frequency chip 463 includes a first radio frequency chip and a second radio frequency chip, the first radio frequency chip and the second radio frequency chip are communicatively connected to each other, the first radio frequency chip is connected to the first controller 461, and the second radio frequency chip is connected to the second controller 462.

In this embodiment, both the first radio frequency chip and the second radio frequency chip are CC2530 radio frequency chips.

A specific working principle is as follows: The first radio frequency chip receives a first control signal of the first controller, and decodes the received first control signal to obtain a second control signal. The second controller conducts further determining and analysis on the second control signal to control the corresponding motor 31 to conduct corresponding adjustment.

The first radio frequency chip is communicatively connected to the second radio frequency chip through a communications module. For example, the communications module may be an antenna. The antenna can convert, to a weak alternating current signal, an electromagnetic wave sent by the first radio frequency chip, conduct filtering, high-frequency amplification, and modulation and demodulation on the weak alternating current signal, and send a processed alternating current signal to the subsequent second radio frequency chip and the second controller for further processing.

To provide action instructions to the controller, in the semiconductor production equipment provided in this embodiment, as shown in FIG. 3, a control button 50 is also arranged on the rack. The control button 50 is connected to the controller 46 of the conveyor device, and is configured to provide action instructions to the controller 46. The control button 50 includes an up-shift button 51, a down-shift button 52, and a reset button 53, the up-shift button 51, the down-shift button 52, and the reset button 53 are connected to the controller.

The up-shift button 51 is configured to send an up-shift instruction to the controller 46, and the controller 46 controls, according to the up-shift instruction, the driving mechanism to drive the conveyor platform to move up relative to the machine platform. The down-shift button 52 is configured to send a down-shift instruction to the controller 46, and the controller 46 controls, according to the down-shift instruction, the driving mechanism to drive the conveyor platform 30 to move down relative to the machine platform. The reset button 53 is configured to send a reset instruction to the controller 46, and the controller controls, according to the reset instruction, the switch of the conveyor device to be turned on.

Figure 12:
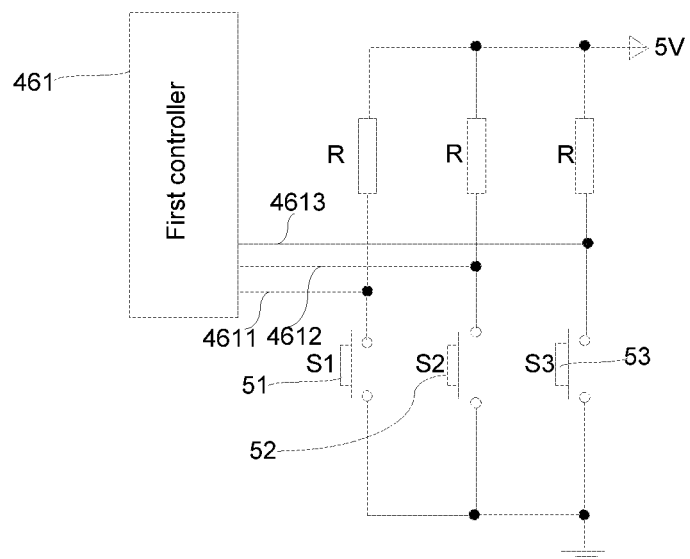
FIG. 12 is a circuit diagram of a controller and a control button according to an embodiment of this application.

In this embodiment, the foregoing control button 50 is implemented by using a keying circuit. For example, as shown in FIG. 12, the first controller 461 is provided with a first pin 4611, a second pin 4612, and a third pin 4613. One end of the up-shift button 51 is connected to the first pin 4611 and a power supply voltage of the first controller 461 respectively, and the other end of the up-shift button 51 is grounded. One end of the down-shift button 52 is connected to the second pin 4612 and the power supply voltage of the first controller 461 respectively, and the other end of the down-shift button 52 is grounded. One end of the reset button 53 is connected to the third pin 4613 and the power supply voltage of the first controller 461 respectively, and the other end of the reset button is grounded.

When the up-shift button is pressed, a voltage at the first pin is 0. When the up-shift button is disconnected, the voltage at the first pin is 5 V, and the first controller determines, according to a change in the voltage at the first pin, whether the up-shift button is pressed. When the first controller detects that the voltage at the first pin is 0, the first controller executes an up-shift instruction, and transmit the up-shift instruction to the driver, so that the driver drives the support piece to move up to support the conveyor platform, and drives the conveyor platform to move up relative to the machine platform.

Execution commands of the down-shift button and the reset button are similar to that of the up-shift button. Details are not repeated in this embodiment.

In an actual working process, if the maintenance or repair needs to be conducted on the semiconductor production equipment, the operator manually presses the up-shift button. After receiving an up-shift instruction, the first controller controls the driver to move, so that the driver drives the support plate to move up relative to the machine platform. In this case, the first controller simultaneously controls the signal transmitter and the signal receiver to work, and calculates, according to a second signal, a distance between the support plate and the conveyor platform. When the distance between the support plate and the conveyor platform is approximately zero, the first controller receives pressure detected by the pressure sensor, and compares the pressure value with the preset threshold. If the pressure value is greater than 100 N, it indicates that the support plate can fully support the conveyor platform.

The first controller transmits the signal to the second controller, and the second controller controls the switch connected to the motor to be turned off. In this case, the motor configured to drive the conveyor platform to move is powered off.

The first controller controls the driver to continue to work, and drives the conveyor platform to move up relative to the rack until the oil injection ports covered by the conveyor platform is exposed. The first controller controls the conveyor platform to stay at a specific position. In this case, the operator can inject the oil into the oil injection ports.

After oil injection is completed, the operator manually presses the down-shift button, and the driver drives the support plate and the conveyor platform to move down relative to the rack until the conveyor platform falls back to the guide structure.

Finally, the operator manually presses the reset button, and the second controller controls the switch connected to the motor to be turned on. In this case, the motor configured to drive the conveyor platform to move is restored to be powered on, and the conveyor platform stays at the guide structure.

In addition, the driver drives the support plate to continue to move down. In this case, the first controller determines, according to the distance between the support plate and the conveyor platform, whether the support plate falls back to an original position. If the support plate falls back to the original position, the first controller controls the driver to stop movement, so as to complete an entire movement process.

Each embodiment or implementation in this specification is described in a progressive manner. Each embodiment focuses on the difference from other embodiments, and the same and similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described with reference to the implementation(s) or example(s) is included in at least one implementation or example of this application. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of this application, but are not intended to limit this application. Although this application is described in detail with reference to the foregoing embodiments, persons of ordinary skill in the art should understand that they can still modify the technical solutions described in the foregoing embodiments, or make equivalent replacements on some or all technical features therein. These modifications or replacements do not make the essence of the corresponding technical solutions deviate from the spirit and scope of the technical solutions of the embodiments of this application.

The invention claimed is:

1. A conveyor device, installed on a machine platform of semiconductor production equipment, wherein the machine platform is provided with a guide structure, and the guide structure is provided with multiple oil injection ports arranged along an extension direction of the guide structure; and the conveyor device comprises:
 a conveyor platform, wherein the conveyor platform is slidably installed on the guide structure to carry and convey wafers, and the conveyor platform covers at least one of the multiple oil injection ports; and
 a driving mechanism, wherein the driving mechanism is connected to the conveyor platform, and the driving mechanism is configured to drive the conveyor platform to move up or down relative to the machine platform, to expose the oil injection ports covered by the conveyor platform.

2. The conveyor device according to claim 1, wherein the driving mechanism comprises a support piece and a driver connected to the support piece; and
 the support piece is located below the conveyor platform, and is connected to the conveyor platform; and the driver drives, by the support piece, the conveyor platform to move up or down relative to the machine platform.

3. The conveyor device according to claim 2, wherein the support piece comprises a support plate, one end of the driver is connected to an upper surface of the support plate or a lower surface of the support plate, and the other end of the driver is connected to the machine platform.

4. The conveyor device according to claim 3, wherein the driver comprises at least one driving cylinder, one end of the driving cylinder is fixedly connected to the support plate by a connecting rod, and the other end of the driving cylinder is fixedly connected to the machine platform.

5. The conveyor device according to claim 2, wherein the conveyor device further comprises a signal transmitter arranged on the conveyor platform, a signal receiver arranged on an upper surface of a support plate facing toward the conveyor platform, and a controller electrically connected to the signal transmitter and the signal receiver respectively; the controller is configured to control the signal transmitter to send a first signal to the signal receiver, and control, according to a second signal output by the signal receiver, a speed of the driver for driving the conveyor platform to move up or down relative to the machine platform; and the second signal is generated by the signal receiver through conversion of the first signal.

6. The conveyor device according to claim 5, wherein the signal transmitter is a light-emitting diode, and the signal receiver is a photoelectric sensor; and
the photoelectric sensor comprises a signal processor, and the signal processor is configured to process the first signal to convert the first signal to the second signal.

7. The conveyor device according to claim 5, wherein at least one pressure sensor is arranged on the upper surface of the support plate facing toward the conveyor platform, and the pressure sensor is configured to detect pressure borne by the support plate; and
the controller is connected to the pressure sensor, and the controller is configured to control, according to a pressure value detected by the pressure sensor, the speed of the driver for driving the conveyor platform to move up or down relative to the machine platform.

8. The conveyor device according to claim 7, wherein the conveyor device further comprises a motor connected to the conveyor platform and a switch connected to the motor, the switch is connected to the controller, and the controller is configured to control, according to the second signal and/or the pressure detected by the pressure sensor, the switch to be turned on or off.

9. The conveyor device according to claim 8, wherein the controller comprises a first controller, a radio frequency chip, and a second controller, and the first controller is connected to the second controller by the radio frequency chip;
the first controller is respectively connected to the signal receiver, the pressure sensor, and the driver, and the first controller is configured to control, according to the second signal and the pressure detected by the pressure sensor, the speed of the driver for driving the conveyor platform to move up or down relative to the machine platform; and
the second controller is connected to the switch, and the second controller is configured to control, according to an output signal of the first controller, the switch to be turned on or off.

10. The conveyor device according to claim 9, wherein the radio frequency chip comprises a first radio frequency chip and a second radio frequency chip, the first radio frequency chip and the second radio frequency chip are communicatively connected to each other, the first radio frequency chip is connected to the first controller, and the second radio frequency chip is connected to the second controller.

11. The conveyor device according to claim 10, wherein the first controller controls, by a solenoid valve, the speed of the driver for driving the conveyor platform to move up or down relative to the machine platform.

12. A semiconductor production equipment, comprising a machine platform and the conveyor device according to claim 1, wherein
the machine platform comprises a rack and a guide structure arranged on the rack, and the guide structure is provided with multiple oil injection ports arranged along an extension direction of the guide structure; and
the conveyor platform of the conveyor device is slidably installed on the guide structure, and the conveyor platform covers at least one of the multiple oil injection ports; one end of a driving mechanism of the conveyor device is arranged on the rack, and the other end of the driving mechanism is connected to the conveyor platform; the driving mechanism is configured to drive the conveyor platform to move up or down relative to the machine platform, to expose the oil injection ports covered by the conveyor platform.

13. The semiconductor production equipment according to claim 12, wherein a driver of the driving mechanism is welded to the rack.

14. The semiconductor production equipment according to claim 13, wherein a control button is arranged on the rack; the control button is connected to a controller of the conveyor device, and the control button is configured to provide action instructions to the controller.

15. The semiconductor production equipment according to claim 14, wherein the control button comprises an up-shift button, a down-shift button, and a reset button, the up-shift button, the down-shift button, and the reset button are connected to the controller;
the up-shift button is configured to send an up-shift instruction to the controller, and the controller controls, according to the up-shift instruction, the driving mechanism to drive the conveyor platform to move up relative to the machine platform;
the down-shift button is configured to send a down-shift instruction to the controller, and the controller controls, according to the down-shift instruction, the driving mechanism to drive the conveyor platform to move down relative to the machine platform; and
the reset button is configured to send a reset instruction to the controller, and the controller controls, according to the reset instruction, a switch of the conveyor device to be turned on.

\* \* \* \* \*